(12) United States Patent
Lee

(10) Patent No.: US 9,208,890 B2
(45) Date of Patent: Dec. 8, 2015

(54) SEMICONDUCTOR DEVICE AND OPERATING METHOD THEREOF

(71) Applicant: SK hynix Inc., Icheon-si Gyeonggi-do (KR)

(72) Inventor: Hee Youl Lee, Icheon-si (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 14/322,662

(22) Filed: Jul. 2, 2014

(65) Prior Publication Data

US 2015/0228348 A1    Aug. 13, 2015

(30) Foreign Application Priority Data

Feb. 10, 2014    (KR) .......................... 10-2014-0015026

(51) Int. Cl.

| | | |
|---|---|---|
| G11C 11/34 | (2006.01) | |
| G11C 16/16 | (2006.01) | |
| G11C 16/08 | (2006.01) | |
| G11C 16/34 | (2006.01) | |
| G11C 11/56 | (2006.01) | |
| G11C 16/04 | (2006.01) | |

(52) U.S. Cl.
CPC ............ *G11C 16/16* (2013.01); *G11C 11/5628* (2013.01); *G11C 11/5635* (2013.01); *G11C 16/0483* (2013.01); *G11C 16/08* (2013.01); *G11C 16/3445* (2013.01)

(58) Field of Classification Search
CPC .... G11C 16/26; G11C 11/5628; G11C 16/08; G11C 16/12; G11C 16/16; G11C 11/5635; G11C 7/1087; H01L 25/0657

USPC ............ 365/185.11, 185.03, 185.18, 185.24, 365/185.23, 189.011, 189.16
See application file for complete search history.

(56) References Cited

U.S. PATENT DOCUMENTS

| | | | |
|---|---|---|---|
| 6,327,183 B1 * | 12/2001 | Pawletko et al. ........ | 365/185.18 |
| 2010/0091582 A1 * | 4/2010 | Vali et al. ................. | 365/189.05 |
| 2012/0170378 A1 * | 7/2012 | Aritome et al. .......... | 365/185.24 |

FOREIGN PATENT DOCUMENTS

| | | |
|---|---|---|
| KR | 1020100049809 A | 5/2010 |
| KR | 1020100117904 A | 11/2010 |
| KR | 1020110075312 A | 7/2011 |

* cited by examiner

*Primary Examiner* — Fernando Hidalgo
(74) *Attorney, Agent, or Firm* — William Park & Associates Ltd.

(57) ABSTRACT

An operating method of a semiconductor device includes repeating an erase loop operable to lower threshold voltages of memory cells in a selected memory block by applying an erase voltage to the selected memory block and performing an erase verification to determine whether the threshold voltages of the memory cells in the selected memory block are less than or equal to a target level, wherein an erase voltage is increased by a voltage difference wherein the voltage difference is increased between successive applications of two or more of the erase loops, and repeating a program loop including applying a program voltage to a selected word line to increase threshold voltages of memory cells electrically coupled to the selected word line and performing a program verification to determine whether the threshold voltages are greater than or equal to a target level, wherein a program voltage is increased by a voltage difference wherein the voltage difference is increased between successive applications of two or more program voltages.

19 Claims, 6 Drawing Sheets

SEMICONDUCTOR DEVICE AND OPERATING METHOD THEREOF

CROSS-REFERENCE TO RELATED APPLICATION

The present application claims priority to Korean patent application number 10-2014-0015026 filed on Feb. 10, 2014, in the Korean Intellectual Property Office, the entire disclosure of which is incorporated by reference herein.

BACKGROUND

1. Technical Field

Various embodiments relate to a semiconductor device and an operating method thereof, and more particularly, to an erase operation of a semiconductor device.

2. Related Art

A semiconductor device often includes a memory cell array, a circuit group and a control circuit. The memory cell array includes a plurality of memory blocks and is configured to store data. The circuit group is typically configured to perform one or more of program operations, read operations and erase operations associated with a selected memory block in the memory cell array. The control circuit is typically configured to control the operation of the circuit group.

In many cases, the control circuit is configured to issue commands to the circuit group to perform various operations based on one or more setting values associated with each of the operations.

For example, when an erase operation is performed on a selected memory block selected from among the plurality of memory blocks, an erase voltage Vera is applied to a well of the selected memory block. The threshold voltages of the memory cells are lowered by voltage differences between the memory cells in the selected memory block and a channel, and the erase operation is performed.

In many cases, an erase operation that employs an incremental step pulse erase (ISPE) method that gradually increases an erase voltage Vera is used. During the implementation of the ISPE method, a plurality of erase loops are repeatedly performed. Each of the erase loops includes the application of the erase voltage Vera to a well of the selected memory block, and determining whether the threshold voltages of the memory cells in the selected memory block has been lowered to a target level. Based on the determination, the erase voltage Vera may be increased by a constant step voltage Vstep if the erase loop is repeated. As shown in Table 1, the step voltage Vstep is typically maintained at a constant voltage and the erase voltage is incrementally increased by the constant step voltage Vstep with each repetition of the erase loop.

TABLE 1

| Erase loop count | Erase voltage | Voltage difference |
|---|---|---|
| 1 | Vera | |
| 2 | Vera + Vstep | Vstep |
| 3 | Vera + 2Vstep | Vstep |
| 4 | Vera + 3Vstep | Vstep |
| ... | ... | ... |
| k − 1 | Vera + (k − 2)Vstep | Vstep |
| K | Vera + (k − 1)Vstep | Vstep |

BRIEF SUMMARY

An embodiment of an operating method of a semiconductor device includes repeating an erase loop operable to lower threshold voltages of memory cells in a selected memory block by applying an erase voltage to the selected memory block and performing an erase verification to determine whether the threshold voltages of the memory cells are less than or equal, wherein an erase voltage is increased by a voltage difference wherein the voltage difference is increased between successive applications of two or more erase loops.

An embodiment of an operating method of a semiconductor device includes repeating a program loop including applying a program voltage to a selected word line to increase threshold voltages of memory cells electrically coupled the selected word line and performing a program verification to determine whether the threshold voltages are greater than or equal to a target level, wherein a program voltage is increased by a voltage difference, wherein the voltage difference is increased between successive application of at least two or more program voltages.

An embodiment of a semiconductor device includes a memory block configured to store data, a circuit group configured to erase and program memory cells in the memory block, and a control circuit configured to repeat an erase loop operable to lower threshold voltages of memory cells in a selected memory block by applying an erase voltage to the selected memory block and performing an erase verification to determine whether the threshold voltages of the memory cells in the selected memory block are less than or equal to a target level, wherein an erase voltage is increased by a voltage difference wherein the voltage difference is increased between successive applications of two or more of the erase loops, and to repeat a program loop including applying a program voltage to a selected word line to increase threshold voltages of memory cells electrically coupled to the selected word line and performing a program verification to determine whether the threshold voltages are greater than or equal to a target level, wherein a program voltage is increased by a voltage difference wherein the voltage difference is increased between successive applications of two or more program voltages.

DETAILED DESCRIPTION

Figure 1:
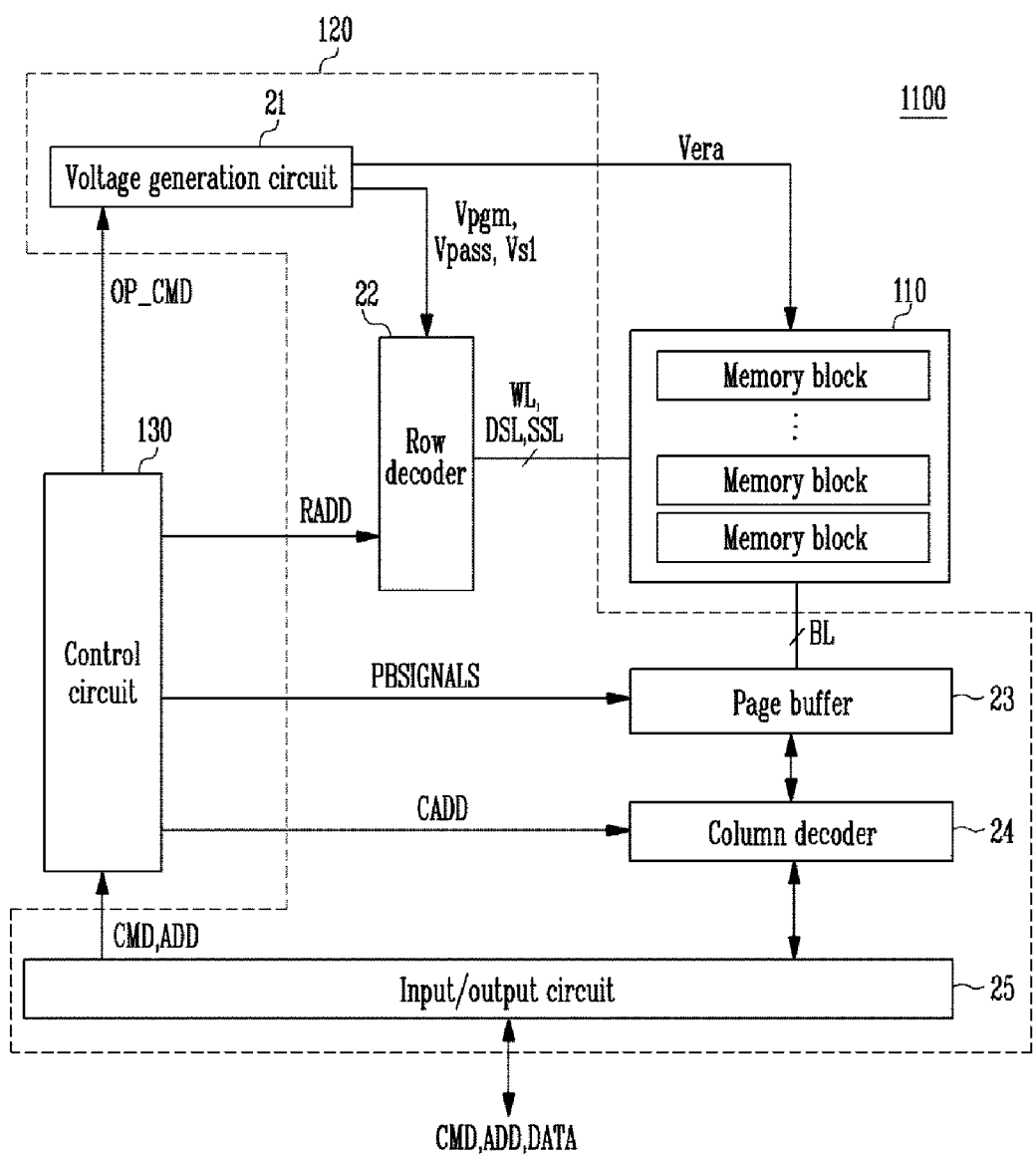
FIG. 1 is a block diagram representation of an embodiment of a semiconductor device.

Referring to FIG. 1 a block diagram representation of an embodiment of a semiconductor device is shown.

The semiconductor device 1100 includes a memory cell array 110, a circuit group 120 and a control circuit 130. The memory cell array 110 may be configured to store data. The circuit group 120 may be configured to perform one or more of a program operation, a read operation and an erase operation of the memory cell array 110. The control circuit 130 may be configured to control the circuit group 120.

The memory cell array 110 may include a plurality of memory blocks. Each of the plurality of memory blocks may include single level cells (SLCs) or multi-level cells (MLCs) configured to store least significant bit (LSB) data and most significant bit (MSB) data. The memory blocks may be configured to have substantially the same structure. The circuit group 120 may include a voltage generation circuit 21, a row decoder 22, a page buffer 23, a column decoder 24 and an input/output circuit 25.

The voltage generation circuit 21 may be configured to generate different operation voltages in response to an operation command signal OP_CMD. For example, when the voltage generation circuit 21 receives an operation command signal OP_CMD associated with an erase operation, the voltage generation circuit 21 responsively generates an erase voltage Vera, a pass voltage Vpass and a turn-on voltage Vsl. The voltage generation circuit 21 may be configured to generate different voltages in response to different operation command signals OP_CMD associated with different operations. During the performance of an erase operation, the erase voltage Vera is applied to the memory cell array 110, and the pass voltage Vpass and the turn-on voltage Vsl are applied to the row decoder 22. During the performance of a program operation, a program voltage Vpgm, the pass voltage Vpass and the turn-on voltage Vsl are applied to the row decoder 22. The erase voltage Vera is applied to a well of a selected memory block selected from among a plurality of memory blocks in the memory cell array 110, or to a junction electrically coupled to a source line. The program voltage Vpgm is applied to a selected word line of the selected memory block. The row decoder 22 is configured to select one of the memory blocks in the memory cell array 110 in response to a row address RADD, and transmit the operation voltages to word lines WL, drain select lines DSL and source select lines SSL associated with the selected memory block.

The page buffer 23 is electrically coupled to the memory blocks via bit lines BL. The page buffer 23 is configured to transmit data to and receive data from the selected memory block during the program, read and erase operations, and to temporarily store received data.

The column decoder 24 is configured to transmit data to and receive data from the page buffer 23 in response to a column address CADD.

The input/output circuit 25 is configured to transmit a command signal CMD and an address ADD received from an external device external to the control circuit 130. The input/output circuit 25 is configured to transmit data DATA to the column decoder 24, and to transmit the data DATA received from the column decoder 24 to an external device or to transmit the data DATA to the control circuit 130.

The control circuit 130 is configured to control the operation of the circuit group 120 in response to the command signal CMD and the address ADD. The control circuit 130 is configured to control the operation of the circuit group 120 by issuing commands to the circuit group 130 to gradually increase a voltage difference between successive the erase voltages generated during the performance of the erase operation. For example, the performance of the erase operation includes repeating a plurality of erase loops including the application of the erase voltage until the threshold voltages of all of the memory cells of the selected memory block are lowered to a target level and verifying erasure. The control circuit 130 controls the operation of the circuit group 120 where the circuit group 120 is configured to increase the voltage difference as the number of the erase loops increase. The control circuit 130 controls the operation of circuit group 120 where the circuit group 120 is configured to gradually increase a voltage difference between the program voltages during the program operation, and to gradually increase the voltage difference between the program voltages as the number of the program loops increase.

The control circuit 130 controls the operation of the circuit group 120 where the circuit group 120 is configured to increase an operation time of applying the erase voltage as the number of the erase loops increase, or increase an operation time of applying the program voltage as the number of the program loops increase.

The memory block described above, may be implemented as a memory block having a 2-dimensional structure or a 3-dimensional structure. Both types of the memory blocks will be described below.

Figure 2:
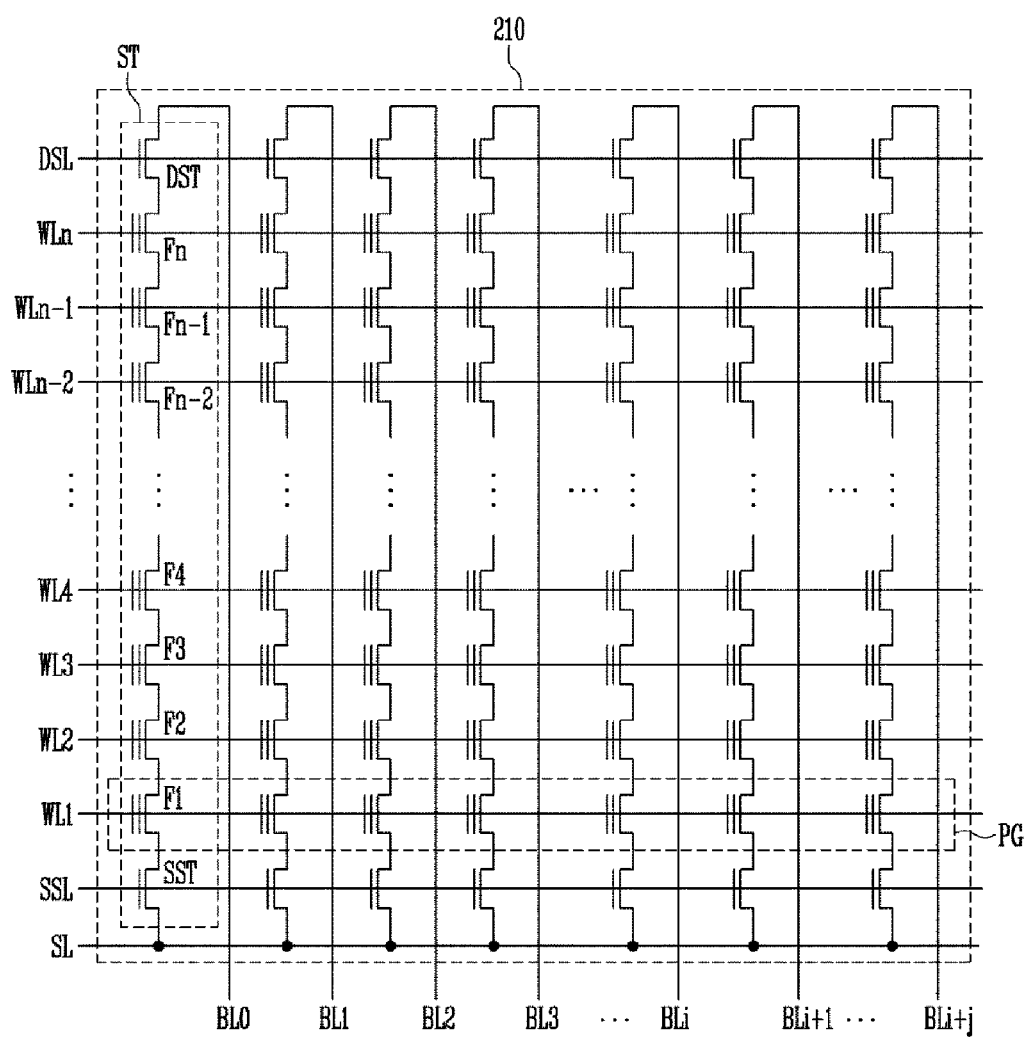
FIG. 2 is a circuit diagram representation of a 2-dimensional memory block.

Referring to FIG. 2 is a circuit diagram representation of a 2-dimensional memory block is shown.

The memory block is an example of one of the memory blocks of the plurality of memory blocks. Each of the memory blocks in the plurality of memory blocks are configured to have substantially the same structure. The memory block includes a plurality of strings ST. Each of the strings ST in the plurality of strings ST are configured to have substantially the same structure. The following description will be directed to one of the strings ST.

The string ST includes a drain select transistor DST, memory cells F0-Fn and a source select transistor SST. The drain select transistor DST, the memory cells F0-Fn and the source select transistor SST are electrically coupled in series. A drain of the drain select transistor DST is electrically coupled to a bit line BL0, and a source of the source select transistor SST is electrically coupled to a source line SL. The gates of the drain select transistors DST of each of the strings ST are electrically coupled to a drain select line DSL. The gates of the memory cells F0-Fn are electrically coupled to the word lines WL0-WLn. The gates of the source select transistors SST are electrically coupled to a source select line SSL. The strings ST are electrically coupled to bit lines BL0-BLi+j. In the 2-dimensional memory block described above, an erase voltage Vera may be applied to a well of a selected memory block, and a program voltage Vpgm may be applied to a selected word line of the selected memory block.

Figure 3:
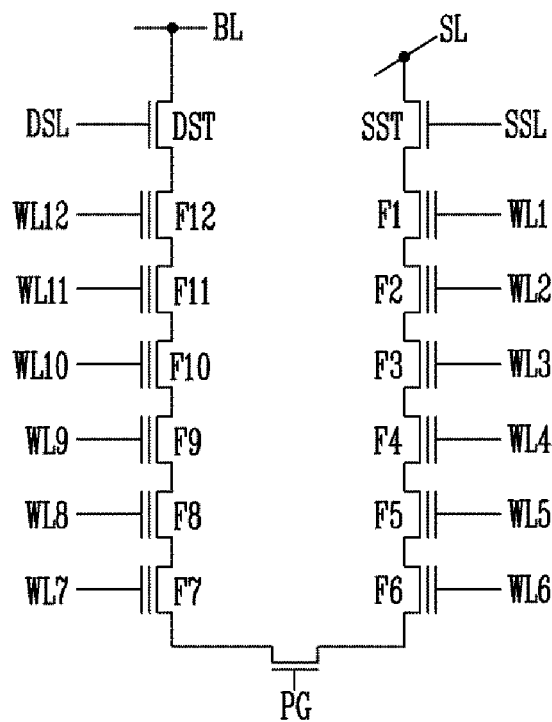
FIG. 3 is a circuit diagram representation of a 3-dimensional memory block.

Referring to FIG. 3 is a circuit diagram representation of a 3-dimensional memory block is shown.

Each of strings ST is formed in a generally 'U' shape. Each of the strings ST in the plurality of strings ST have substantially the same structure. One of the strings will be described as an example below. Each generally "U" shaped string ST has an upper portion and a lower portion. The upper portion has two ends. One end of the upper portion of the string ST is electrically coupled to a source line SL and the other end of the upper portion is electrically coupled to a bit line BL. The pipe gate PG is electrically coupled to the lower portion of the string ST. First, second, third, fourth, fifth and sixth memory cells F1, F2, F3, F4, F5, F6 and a source select transistor SST may be electrically coupled in series between the pipe gate PG and the source line SL. Seventh, eighth, ninth, tenth, eleventh and twelfth memory cells F7, F8, F9, F10, F11, F12 and a drain select transistor DST may be electrically coupled in series between the pipe gate PG and the bit line BL.

The first, second, third, fourth, fifth and sixth memory cells F1, F2, F3, F4, F5, F6 are vertically electrically coupled with one another in series, and the first memory cell F1 is disposed adjacent to a lower portion of the source select transistor SST. The seventh, eighth, ninth, tenth, eleventh and twelfth memory cells F7, F8, F9, F10, F11, F12 are vertically electrically coupled with one another in series, and the twelfth memory cell F12 is disposed adjacent to a lower portion of the drain select transistor DST. The gates of the first through twelfth memory cells F1, F2, F3, F4, F5, F6, F7, F8, F9, F10, F11, F12 are electrically coupled to first through twelfth word lines WL1, WL2, WL3, WL4, WL5, WL6, WL7, WL8, WL9, WL10, WL11, WL12, respectively.

In the 3-dimensional memory block described above, an erase voltage Vera may be applied to a junction electrically coupled to the source line, and a program voltage Vpgm may be applied to a selected word line of a selected memory block.

Since the 3-dimensional memory block described above includes generally 'U'-shaped strings, the erase voltage is applied to the junction that is electrically coupled to the source line to apply the erase voltage Vera to the source line that is electrically coupled to the upper portion of the generally 'U'-shaped string. In a semiconductor device including a 3-dimensional memory block including generally 'I'-shaped strings, the source line may be disposed on a lower portion of the strings and the erase voltage may be applied to a well of the selected memory block in this structure.

While memory blocks including generally "U" shaped strings and memory blocks including generally "I" shaped strings have been described, the memory block may include strings having alternative configurations.

Embodiments of an erase operation and embodiments of a program operation of an embodiment of a semiconductor device will be described below.

Figure 4:
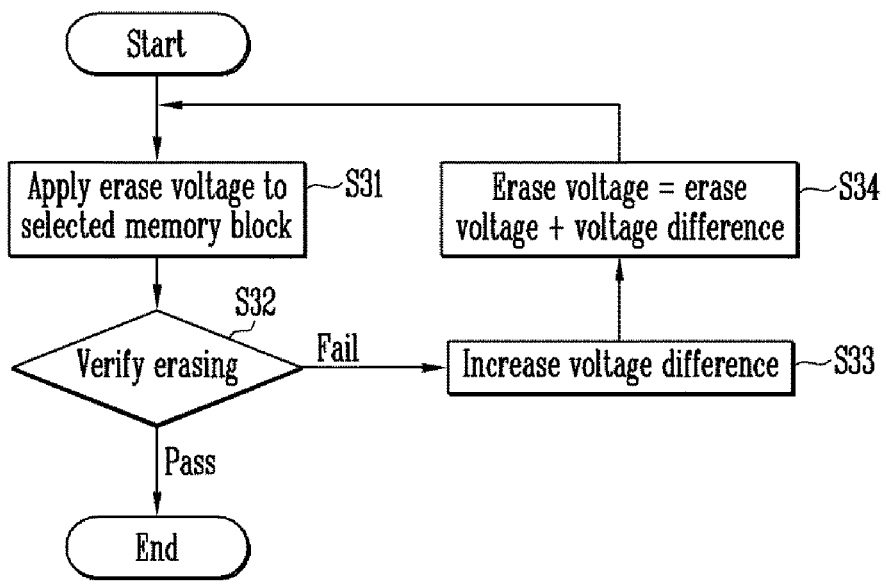
FIG. 4 is a flowchart representation of an embodiment of an erase operation.

Referring to FIG. 4, a flowchart representation of an embodiment of an erase operation is shown.

The erase operation generally lowers the threshold voltages of memory cells. However, in order to lower a width of a threshold voltage distribution, the erase operation is performed using an incremental step pulse erase (ISPE) method where an erase voltage Vera is gradually increased. In order to lower the threshold voltages of the memory cells in a selected memory block, the erase voltage is applied to the selected memory block (S31). For example, an erase allowable voltage is applied to all of the word lines electrically coupled to the selected memory block, and the erase voltage is applied to a well or a junction of the selected memory block based on the structure of the memory block as described above. The erase voltage used in a first erase loop is called a start voltage, the start voltage may be approximately 16 V, and the erase allowable voltage may be approximately 0 V.

Following the application of the erase voltage for a predetermined period of time, an erase verify operation is performed (S32). For example, the erase verify operation is performed to determine whether the threshold voltages of all the memory cells in the selected memory block have been lowered to a target level. If all memory cells of the selected memory block pass the erase verify operation, the erase operation on the selected memory block ends. If it is determined that the threshold voltages of one or more of the memory cells have not been lowered to the target level, the erase verify operation fails, and a setting operation to perform the next erase loop is performed. If almost all of the memory cells of the selected memory block pass the erase verify operation, the erase operation on the selected memory block ends. If it is determined that the threshold voltages of a number of the memory cells have not been lowered to the target level, the erase verify operation fails, and a setting operation to perform the next erase loop is performed.

During the setting operation to perform the next erase loop, a voltage difference is used to increase the value of the erase voltage (S33). The voltage difference is called a step voltage. For example, in a second erase loop, the erase voltage used is relatively higher than the erase voltage used in the previous erase loop by a voltage difference of 'a.' In a third erase loop, the erase voltage used is relatively higher than the erase voltage used in the previous erase loop by a voltage difference 'b.' In a fourth erase loop, the erase voltage is relatively higher than the erase voltage used in the previous erase loop by a voltage difference 'c.' The value of the voltage difference 'c' is relatively greater than the value of the voltage difference 'b,' and the value of the voltage difference 'b' is relatively greater than the value of the voltage difference 'a.' The voltage difference is set at relatively higher values as the number of the erase loops increases.

Once the voltage difference has been set to a relatively higher value, the erase voltage is set to a voltage that is relatively higher than the erase voltage used in the previous erase loop by the set voltage difference (S34).

Once the erase voltage has been set, the erase operation is performed where the set erase voltage is applied to the selected memory block to lower the threshold voltages of the memory cells in the selected memory block.

The erase voltage does not increase by a constant voltage difference value but increases by relatively higher voltage difference values with the performance of each successive erase loop. The value of the voltage difference of the erase voltage described above may be gradually increased using a number of different methods. An embodiment of such a method is described below.

When the erase operation is started, variables 'i' and 'j' are set. An initial value of the variable 'i' is set to be '−j.' The variables 'i' and 'j' are the setting values used to increase a voltage difference. The variables 'i' and 'j' may be set in advance before the erase operation is initiated. For example, if the variable 'j' is set to be '0.1', the initial value of the variable 'i' is set to '−0.1.'

Once the variables 'i' and 'j' used in the erase operation for a specific erase loop are set, the erase allowable voltage is applied to all of the word lines electrically coupled to the selected memory block, the erase voltage is applied to the selected memory block and the threshold voltages of the memory cells are lowered. The erase voltage used in the first erase loop may be approximately 16 V, and the erase allowable voltage may be approximately 0 V.

The erase verify operation is performed following the application of the erase voltage to the selected memory block for a predetermined period of time.

If the erase verify operation fails, the variable 'i' is set according to Equation 1.

$$i = i + j \qquad \text{Equation 1}$$

Since the initial value of the variable 'i' is '−j,' after the first erase loop is performed, the new value of the variable 'i' is set to be '0' in Equation 1.

Once the variable 'i' is set, the erase voltage Vera is set according to Equation 2.

$$Vera=Vera+(Vstep+i) \qquad \text{Equation 2}$$

Following the performance of the first erase loop, since the variable 'i' is set to a value of approximately '0,' the erase voltage Vera is set to 'Vera+Vstep' in accordance with Equation 2. The value of the erase voltage Vera used in the first erase loop is increased by the value of the voltage difference Vstep. The increased value of the erase voltage is set as the new value of the erase voltage Vera.

The next erase loop is performed using the newly set erase voltage Vera. If the erase verify operation fails following the performance of the erase loop using the newly set erase voltage Vera, the values of the variable 'i' and the erase voltage Vera are set again with new values using Equation 1 and Equation 2.

The variable 'i' and the erase voltage Vera are newly set again, and the above-described operations (S31), (S32), (S33) and (S34) are repeated. If the erase verify operation (S32) passes, the erase operation ends.

When the erase operation is performed, as described above, a voltage difference between the erase voltages gradually increases as the number of the erase loops increases. For example, when it is assumed that an initial setting value of the variable 'j' is set to be '+0.1,' the start voltage of the erase voltage Vera is set to be approximately '16 V,' and the voltage difference Vstep is set to be approximately '1 V,' the erase voltage Vera is set as follows.

Since the erase voltage Vera is used as the start voltage in the first erase loop, the start voltage is set at approximately '16 V.' In the second erase loop, since the initial setting value of the variable 'i' is '−j,' the variable 'i' is set at '0' according to Equation 1. Since the erase voltage Vera is set to the value of 'Vera+Vstep' according to Equation 2, the value of the erase voltage Vera is set at '17 V' according to '16 V+1 V.' In the third erase loop, since the value of the variable 'i' is set to the value of the variable 'j' in Equation 1, and the erase voltage Vera is set to the value of 'Vera+(Vstep+j)' according to Equation 2, and the erase voltage Vera is set to '18.1 V' according to '17 V+1.1 V.' In fourth erase loop, since the value of the variable 'i' is set to '2j' according to Equation 1, and the erase voltage Vera is set to the value of 'Vera+(Vstep+2j)' according to Equation 2, and the value of the erase voltage Vera is set to '19.3 V' according to '18.1 V+1.2 V.'

The erase voltage Vera does not increase by a constant voltage difference Vstep. The erase voltage increases by the value defined by the variable 'j' that increases by a constant level from the voltage difference Vstep.

Figure 5:
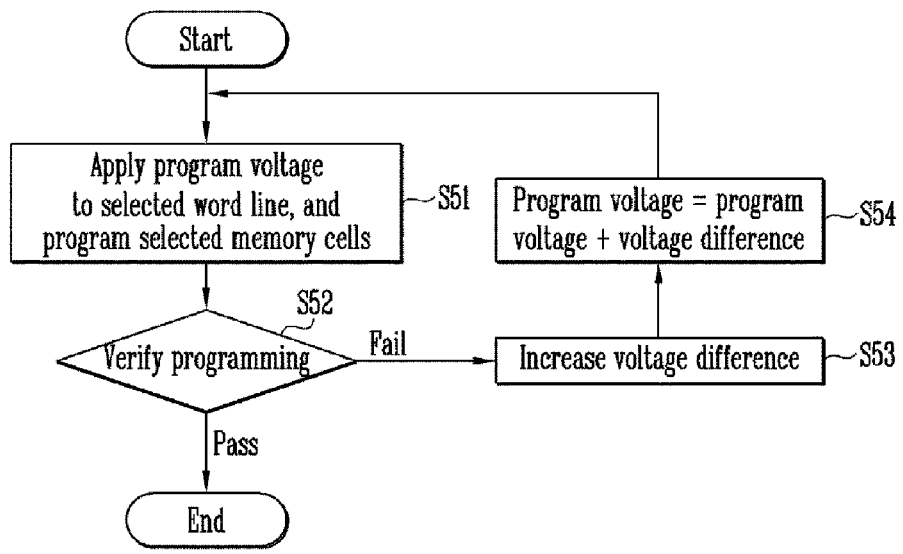
FIG. 5 is a flowchart representation of an embodiment of a program operation.

Referring to FIG. 5 a flowchart representation of an embodiment of a program operation is shown.

The program operation may be performed by gradually increasing a voltage difference between successive program voltages. The program operation increases the threshold voltages of the memory cells. A width of a threshold voltage distribution may be reduced by performing the program operation using the ISPE method where a program voltage Vpgm is gradually increased as described below. The program voltage is applied to a selected word line electrically coupled to the selected memory block. The threshold voltages of the selected memory cells electrically coupled to the selected word line increase in response to the application of the program voltage (S51). The program voltage is applied to the selected word line, a word line selected from among the word lines that are electrically coupled to the selected memory block. A pass voltage is applied to the other word lines. The threshold voltages of the memory cells that are electrically coupled to the selected word line increase.

Following the application of the program voltage for a predetermined period of time, a program verify operation is performed (S52). For example, the program verify operation is performed to determine whether the threshold voltages of the memory cells electrically coupled to the selected word line increase to a target level. If the program verify operation performed on the selected memory cells pass, the program operation on the selected memory cells that are electrically coupled to the selected word line ends. If it is determined that the threshold voltages of one or more of the memory cells that are electrically coupled to the selected word line have not increased to the target level, the program verify operation fails and a setting operation to set the program voltage for the performance of the next program loop is initiated.

During the setting operation to set the program voltage for the performance of the next program loop, a voltage difference of the program voltage is increased (S53). For example, in a second program loop, the program voltage is relatively higher than the program voltage used in the previous or first program loop where a voltage difference increase of 'a' is used. In a third program loop, the program voltage is relatively higher than the program voltage used in the previous or second program loop where a voltage difference increase of 'b' is used. In a fourth program loop, the program voltage is relatively higher than the program voltage used in the previous or third program loop where a voltage difference increase of 'c' is used. The value of the voltage difference increase 'c' is relatively greater than the value of the voltage difference increase 'b,' and the value of the voltage difference increase 'b' is relatively greater than the value of the voltage difference increase 'a.' The voltage difference increases are set at increasingly higher values as the number of the program loops increases.

Following the setting of the voltage difference, the program voltage is set to a voltage that is relatively higher than the program voltage used in the previous program loop by the value of the set voltage difference (S54).

Once the program voltage is set, the program operation i applies the newly set program voltage to the selected memory block to increase the threshold voltages of the selected memory cells.

The program voltage is not increased by a constant voltage difference but by increasing higher voltage difference where the voltage difference used to increase the program voltage in one program loop is relatively higher than the voltage difference used to increase the program voltage in previous program loop.

The values of the voltage differences applied to the program voltage may be increased using a number of different methods. The voltage differences may be increased using Equation 1 and Equation 2, as described with respect to FIG. 4 above.

Figure 6:
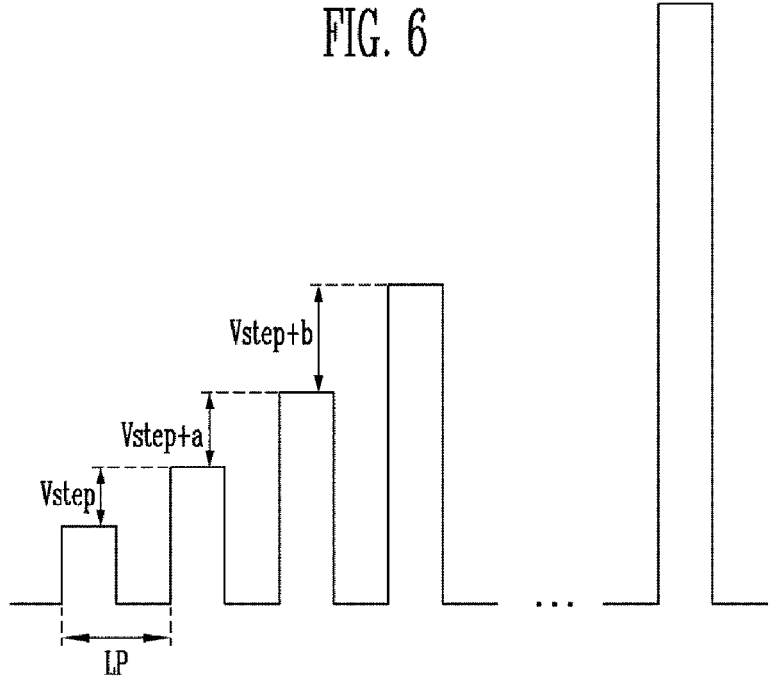
FIG. 6 is a diagram illustrating the application of increasingly higher voltage differences during the implementation of an embodiment an erase operation and an embodiment of a program operation.

Referring to FIG. 6 a diagram illustrating the application of increasingly higher voltage differences during the implementation of an embodiment of an erase operation and an embodiment of a program operation is shown.

The performance of the erase operation and the program operation will be described below with reference to FIG. 6.

Erase Operation

When an erase operation of a selected memory block is initiated, the embodiment of the erase method described above in FIG. 4 may be applied beginning with the first erase loop LP. A difference between the erase voltages Vera applied during a second erase loop and during the first erase loop may be 'Vstep.' A difference between the erase voltages Vera applied during a third erase loop and the second erase loop may be 'Vstep+a.' A difference between the erase voltages Vera applied during a fourth erase loop and the third erase loop may be 'Vstep+b.' The value of the voltage difference increase "b" is relatively greater than the value of the voltage difference increase "a."

Program Operation

When a program operation on the selected memory block is initiated, the embodiment of the program method described above in FIG. 5 may be applied beginning with the first program loop LP. A difference between the program voltages Vpgm applied during a second program loop and during the first program loop may be 'Vstep.' A difference between the program voltages Vpgm applied during a third program loop and the second program loop may be 'Vstep+a.' A difference between the program voltages Vpgm applied during a fourth program loop and during the third program loop may be 'Vstep+b.' The value of the voltage difference increase "b" is relatively greater than the value of the voltage difference increase "a."

Figure 7:
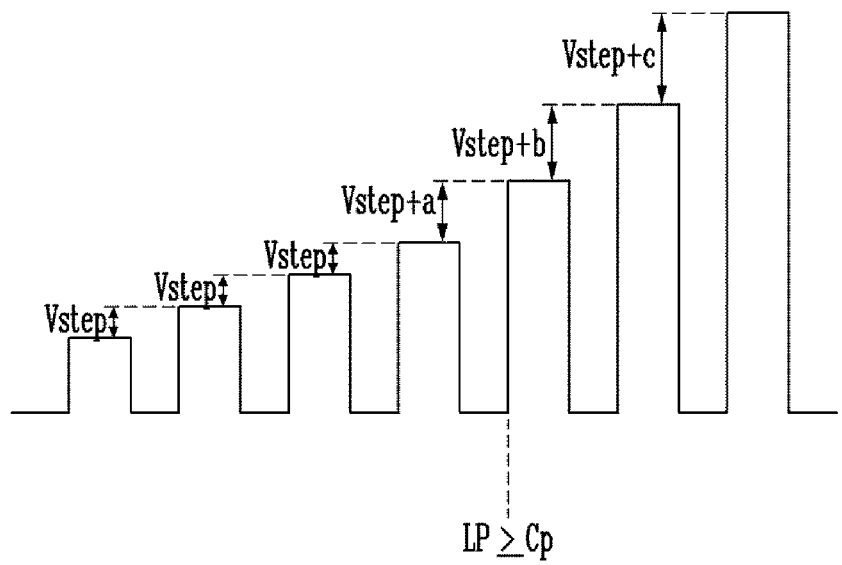
FIG. 7 is a diagram illustrating the application of increasingly higher voltage differences during the implementation of an embodiment of an erase operation and a program operation.

Referring to FIG. 7 a diagram illustrating the application of increasingly higher voltage differences during the implementation of an embodiment of an erase operation and an embodiment of a program operation is shown.

The performance of the erase operation and the program operation will be described below next with reference to FIG. 7.

Erase Operation

When an erase operation is initiated, and the number of erase loops LP performed following the initiation of the erase operation is less than a critical number Cp, the erase voltage Vera is increased by a constant voltage difference during the performance of each successive erase loop LP. When the number of erase loops LP performed following the initiation of the erase operation is equal to or greater than the critical number Cp, the embodiment of the erase operation described with reference to FIG. 4 may be performed. In an embodiment, the critical number Cp may be set arbitrarily. In an embodiment, the critical number may be set as the number erase loops where the relative efficiency of the erase operations begins to decrease during the performance of a test operation. The time at which relative efficiency of the erase operation begins decrease may be based on a failure of the erase voltage Vera to reach a target level, or may be based on a decrease in the speed of lowering the threshold voltages of memory cells.

For example, when the critical number Cp is set to 4, the erase voltage Vera is increased by a constant step voltage Vstep from the performance of the first erase loop through the performance of the fourth erase loop. Once the number of erase loops LP performed is equal to the critical number Cp, the erase voltage Vera may be increased by increasingly higher voltage differences with each successive performance of an erase loop as described above with reference to FIG. 4.

Program Operation

When a program operation is initiated, and the number of program loops LP performed is relatively less than the critical number Cp, a program voltage Vpgm is increased by a constant voltage difference during each successive performance of the program operation. When the number of program loops LP performed following the initiation of the program operation is equal to or greater than the critical number Cp, the embodiment of the program operation described with reference to FIG. 5 may be performed. In an embodiment, the critical number Cp may be set arbitrarily. In an embodiment, the critical number Cp may be set as the number of program loops where the relative efficiency of the program operation begins to decrease during the performance of a test operation. The time at which the relative efficiency of the program operation begins decrease may be based on failure of a program voltage Vpgm to reach the target level, or may be based on a decrease in the speed of raising the threshold voltages of the memory cells.

For example, when the critical number Cp is set to 4, the program voltage Vpgm is increased by the constant step voltage Vstep from the performance of the first program loop through the performance of the fourth program loop. Once the number of program loops LP performed is equal to the critical number Cp, the program voltage Vpgm may be increased by the increasingly higher voltage differences with each successive performance of a program loop as described above with reference to FIG. 5.

Figure 8:
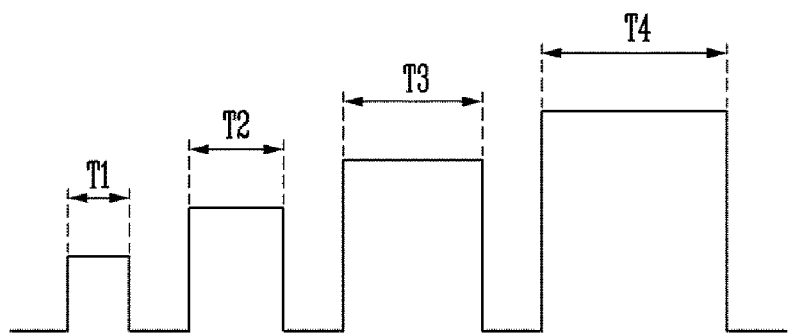
FIG. 8 is a diagram illustrating the implementation of increasingly higher application times during the performance of an embodiment of an erase operation and an embodiment of a program operation.

Referring to FIG. 8 a diagram illustrating the implementation of increasingly higher application times during the implementation of an embodiment of an erase operation and an embodiment of a program operation is shown. The performance of the erase operation and the program operation will be described below with reference to FIG. 8.

Erase Operation

During an implementation of the erase operation, an application time of an erase voltage Vera may be gradually increased with the performance of each successive erase loop. For example, the erase voltage Vera is applied for a first time period T1 during a first erase loop. The erase voltage Vera is increased by a step voltage Vstep and is applied for a second time period T2 during a second erase loop, where the second time period T2 is relatively longer than the first time period T1. In a third erase loop, the erase voltage Vera increased by the step voltage Vstep and is applied for a third time period T3, where the third time period T3 is relatively longer than the second time period T2. In a fourth erase loop, the erase voltage Vera increased by the step voltage Vstep and is applied for a fourth time period T4, where the fourth time period T4 is relatively longer than the third time period T3. The erase voltages Vera and the application times of the erase voltages Vera are gradually increased with the performance of each successive erase loop until an erase verify operation of the selected memory cells is passes.

Program Operation

During an implementation of the program operation, an application time of a program voltage Vpgm may be gradually increased with the performance of each successive program loop. For example, the program voltage Vpgm is applied for the first time period T1 during a first program loop. The program voltage Vpgm is increased by the step voltage Vstep and is applied for a second time period during T2, during a second program loop, where the second time period T2 is relatively longer than the first time period T1. In a third program loop, the program voltage Vpgm is increased by the step voltage Vstep and is applied during a third time period T3, where the time period T3 is relatively longer than the second time period T2. In a fourth program loop, the program voltage Vpgm is increased by the step voltage Vstep and is applied for a fourth time period T4, where the fourth time period is relatively longer than the third time period T3. The program voltages Vpgm and the application times of the program voltage Vpgm are gradually increased with each successive performance of the program loop until a program verify operation of the selected memory cells passes.

Figure 9:
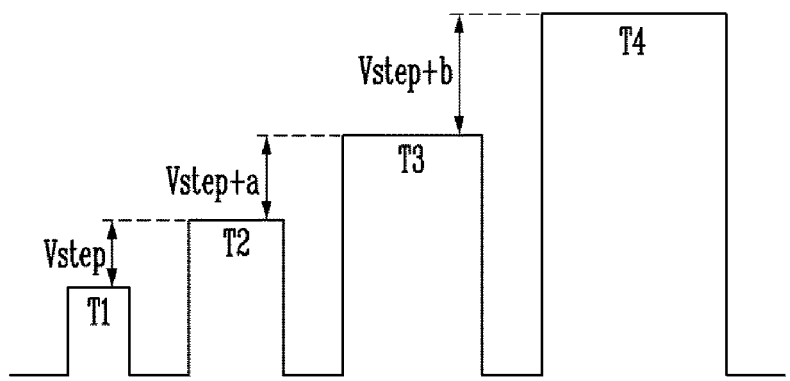
FIG. 9 is a diagram illustrating the application of increasingly higher voltage differences and increasingly higher application times during the implementation of an embodiment of an erase operation and an embodiment of a program operation.

Referring to FIG. 9 a diagram illustrating the implementation of the application of increasingly higher voltage differences and increasingly higher application times during the implementation of an embodiment of an erase operation and an embodiment of a program operation is shown. The performance of the erase operation and the program operation will be described below with reference to FIG. 9.

Erase Operation

During the performance of the erase operation, both a voltage difference of the erase voltages Vera and an application time of the erase voltages Vera are increased with the performance of each successive erase loop. For example, a first erase voltage is applied for a first time period T1 during a first erase loop. A second erase voltage that is relatively higher than the first erase voltage and has a value of Vstep is applied for a second time period T2 during a second erase loop, where the second time period T2 is relatively longer than the first time period T1. In a third erase loop, a third erase voltage that is relatively higher than the second erase voltage and has a value of 'Vstep+a' is applied for a third time period T3, where the third time period T3 is relatively longer than the second time period T2. In a fourth erase loop, a fourth erase voltage that is relatively higher than the third erase voltage and has a value of 'Vstep+b' is applied for a fourth time period T4, where the fourth time period T4 is relatively longer than the third time period T3. The value of 'b' is relatively greater than the value of 'a.' The increases in the voltage differences of the erase voltages Vera and the application times of the erase voltages Vera are gradually increased with the successive performance of each erase loop until an erase verify operation of selected memory cells passes.

When the erase operation is performed the increases in the voltage differences of the erase voltages gradually increase, the application times of the erase voltages gradually increase, or both the increases in the voltage differences of the erase voltages and the application times of the erase voltages gradually increase, and the threshold voltages of the memory cells in the selected memory block are reduced.

Program Operation

During the performance of the program operation, both the increases in a voltage difference of program voltages Vpgm and an application time of the program voltages Vpgm are increased with the performance of each successive program loop. For example, a first program voltage is applied for a first time period T1 during a first program loop. A second program voltage that is relatively than the first program voltage and has a value of Vstep is applied for a second time period T2 during a second program loop, where the second time period T2 is relatively longer than the first time period T1. In a third program loop, a third program voltage that is relatively higher than the second program voltage and has a value of 'Vstep+a' is applied for a third time period T3, where the third time period is relatively longer than the second time T2. In a fourth program loop, a fourth program voltage that is relatively higher than the third program voltage and has a value of 'Vstep+b' is applied for a fourth time period T4, where the fourth time period T4 is relatively longer than the third time period T3. The value of 'b' is relatively greater than the value of 'a.' The increases of the voltage differences of the program voltages Vpgm and the application times of the program voltages Vpgm are gradually increased with the successive performance of each program loop until a program verify operation of the selected memory cells passes.

When the program operation is performed the voltage differences of the program voltage gradually increase, the application times of the program voltages gradually increase, or both the voltage differences of the program voltages and the application times of the program voltages gradually increase, and the threshold voltages of the selected memory cells are reduced.

Figure 10:
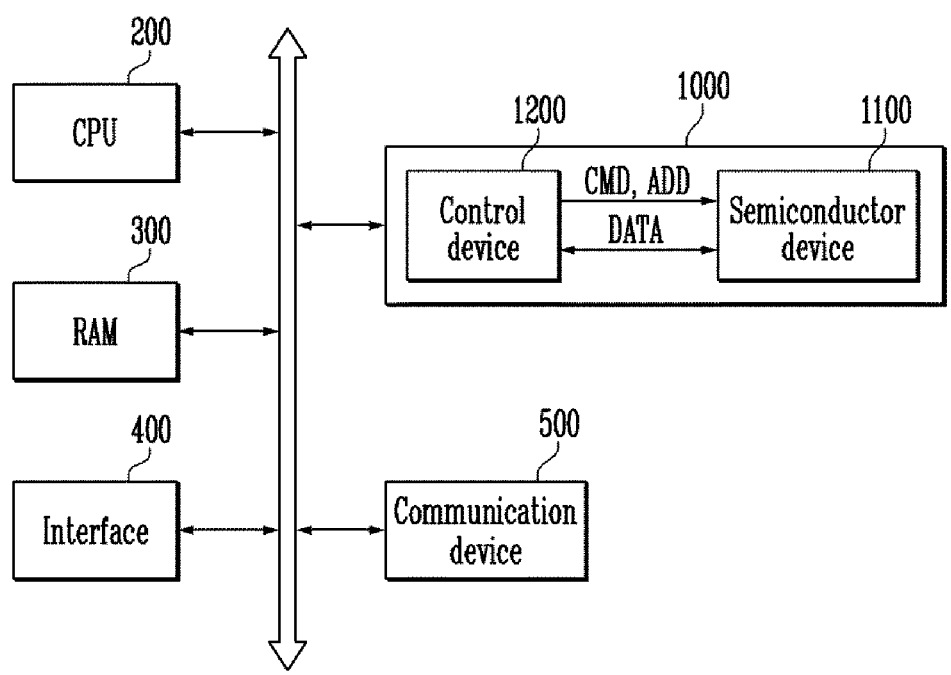
FIG. 10 is a block diagram representation of an embodiment of a semiconductor system.

Referring to FIG. 10 is a block diagram representation of an embodiment of a semiconductor system is shown.

The semiconductor system may include a central processing unit (CPU) 200, a random access memory (RAM) 300, an interface 400 and a memory system 1000, and may further include a communication device 500. Further, when the semiconductor system described in FIG. 8 is a mobile device, the semiconductor system may include a battery (not shown) to provide an operation voltage to each component. Alternately, the semiconductor system may include an application chipset, a camera image processing unit, a mobile dynamic RAM (DRAM), etc. The memory system 1000 may be configured as a solid state drive (SSD) or a fusion flash memory using a non-volatile memory to store data.

The embodiments of the erase operation described above may be implemented in the semiconductor system of FIG. 8.

While certain embodiments have been described above, it will be understood to those skilled in the art that the embodiments described are by way of example only. Accordingly, the semiconductor devices and operating methods of semiconductor devices described herein should not be limited based on the described embodiments. Rather, the semiconductor devices and operating methods of semiconductor devices described herein should only be limited in light of the claims that follow when taken in conjunction with the above description and accompanying drawings.

What is claimed is:

1. An operating method of a semiconductor device, comprising:
    repeating erase loops operable to lower threshold voltages of memory cells in a selected memory block by applying erase voltages to the selected memory block and performing an erase verification to determine whether the threshold voltages of the memory cells in the selected memory block are less than or equal to a target level,
    wherein the erase voltages are increased as a number of erase loops is increased, wherein voltage differences of the erase voltages are increased as the number of erase loops is increased.

2. The operating method of claim 1, wherein repeating an erase loop further comprises:
    using a first erase voltage in a first erase loop;
    using a second erase voltage in a second erase loop, wherein the second erase voltage is relatively higher than the first erase voltage by a first voltage;
    using a third erase voltage in a third erase loop, wherein the third erase voltage is relatively higher than the second erase voltage by a second voltage.

3. The operating method of claim 2, wherein the second voltage is relatively higher than the first voltage.

4. The operating method of claim 1, further comprising:
    increasing a period of time that the erase voltages are applied to the selected memory block as the number of erase loops increases.

5. The operating method of claim 4, wherein repeating an erase loop further comprises:
    applying a first erase voltage to the selected memory block for a first period of time during a first erase loop;
    applying a second erase voltage to the selected memory block for a second period of time during a second erase loop, wherein the second period of time is relatively longer than the first period of time;
    applying a third erase voltage to the selected memory block for a third period of time during a third erase loop, wherein the third period of time is relatively longer than the second period of time.

6. The operating method of claim 1, further comprising:
increasing the erase voltages by a constant voltage difference until the number of erase loops is equal to a critical number.

7. The operating method of claim 6, further comprising:
increasing a period of time that the erase voltage is applied to the selected memory block as the number of erase loops increases.

8. An operating method of a semiconductor device, comprising:
repeating a program loop including applying a program voltage to a selected word line to increase threshold voltages of memory cells electrically coupled to the selected word line and performing a program verification to determine whether the threshold voltages are greater than or equal to a target level,
wherein the program voltage is increased by a step voltage as a number of program loops is increased, wherein the step voltage is increased as the number of program loops is increased.

9. The operating method of claim 8, wherein repeating a program loop comprises:
using a first program voltage in a first program loop;
using a second program voltage in a second program loop, wherein the second program voltage is relatively higher than the first program voltage by a first voltage; and
using a third program voltage in a third program loop, wherein the third program voltage is relatively higher than the second program voltage by a second voltage.

10. The operating method of claim 9, wherein the second voltage is relatively higher than the first voltage.

11. The operating method of claim 8, further comprising:
increasing a period of time that the program voltage is applied to the selected word line as the number of program loops increases.

12. The operating method of claim 11, wherein repeating a program loop further comprises:
applying a first program voltage to the selected word line for a first period of time during a first program loop;
applying a second program voltage to the selected word line for a second period of time during a second program loop, wherein the second period of time is relatively longer than the first period of time; and
applying a third program voltage to the selected word line for a third period of time during a third program loop, wherein the third period of time is relatively longer than the second period of time.

13. The operating method of claim 8, further comprising:
increasing the program voltage by a constant step voltage until the number of program loops is equal to a critical number.

14. The operating method of claim 13, further comprising:
increasing a period of time that the program voltage is applied to the selected word line as the number of program loops increases.

15. A semiconductor device, comprising:
a memory block configured to store data;
a circuit group configured to erase and program memory cells in the memory block; and
a control circuit configured to control the circuit group to repeat an erase loop operable to lower threshold voltages of memory cells in a selected memory block by applying erase voltages to the selected memory block and performing an erase verification to determine whether the threshold voltages of the memory cells in the selected memory block are less than or equal to a target level, wherein the erase voltages are increased as a number of erase loops is increased, wherein first voltage differences of the erase voltages are increased as the number of erase loops is increased, and to repeat a program loop including applying program voltages to a selected word line to increase threshold voltages of memory cells electrically coupled to the selected word line and performing a program verification to determine whether the threshold voltages are greater than or equal to a target level, wherein the program voltages are increased as a number of program loops is increased, wherein second voltage differences of the program voltages are increased as the number of program loops is increased.

16. The semiconductor device of claim 15, wherein the control circuit is configured to issue at least one command to the circuit group to increase a period of time that the erase voltage is applied to the selected memory block as the number of erase loops increases, and to issue at least one command to increase a period of time that the program voltage is applied to the selected word line as the number of program loops increases.

17. The semiconductor device of claim 15, wherein the control circuit is configured:
to issue at least one command to the circuit group to increase the erase voltage by a third voltage difference until the number of erase loops reaches a first critical number, and increase the third voltage difference to the first voltage differences after the number of erase loops is equal to the first critical number with each successive implementation of the erase loop, and
to issue at least one command to the circuit group to increase the program voltage by a fourth voltage difference until the number of program loops reaches a second critical number, and increase the fourth voltage difference to the second voltage differences after the number of program loops is equal to the second critical number with each successive implementation of the program loop.

18. The semiconductor device of claim 15, wherein the memory cells comprise one of 2-dimensional memory cells arranged in a direction generally parallel to a semiconductor substrate and 3-dimensional memory cells arranged in a direction generally perpendicular to the semiconductor substrate.

19. The semiconductor device of claim 15, wherein the circuit group includes:
a voltage generation circuit configured to generate operation voltages having different voltage levels in response to different operation command signals;
a row decoder configured to select the memory block and transmit the operation voltages to the selected memory block in response to a row address;
a page buffer electrically coupled to the memory block via bit lines and configured to transmit data to and receive data from the selected memory block during program, read and erase operations, and configured to temporarily store the received data;
a column decoder configured to transmit data to and receive data from the page buffer in response to a column address; and
an input/output circuit configured to transmit a command signal and an address received from a device external to the control circuit, and to transmit data received from the external device to the column decoder, and to output data received from the column decoder to one of the external device outside and the control circuit.

* * * * *